(12) United States Patent
Singh

(10) Patent No.: US 9,557,351 B2
(45) Date of Patent: Jan. 31, 2017

(54) SENSORLESS CURRENT SENSING METHODS FOR POWER ELECTRONIC CONVERTERS

(71) Applicant: Brij N. Singh, West Fargo, ND (US)

(72) Inventor: Brij N. Singh, West Fargo, ND (US)

(73) Assignee: DEERE & COMPANY, Moline, IL (US)

(*) Notice: Subject to any disclaimer, the term of this patent is extended or adjusted under 35 U.S.C. 154(b) by 485 days.

(21) Appl. No.: 14/132,638

(22) Filed: Dec. 18, 2013

(65) Prior Publication Data

US 2015/0168462 A1    Jun. 18, 2015

(51) Int. Cl.
| | | |
|---|---|---|
| G01R 19/00 | (2006.01) | |
| G01R 31/26 | (2014.01) | |
| H03K 17/14 | (2006.01) | |
| H02P 27/06 | (2006.01) | |

(Continued)

(52) U.S. Cl.
CPC ....... G01R 19/0092 (2013.01); G01R 31/2608 (2013.01); G01R 31/2621 (2013.01); G01R 31/2632 (2013.01); H02P 27/06 (2013.01); H03K 17/145 (2013.01); *G01R 19/32* (2013.01); *H02M 2001/0009* (2013.01); *H03K 2217/0027* (2013.01)

(58) Field of Classification Search
CPC ............ H01L 2224/48091; H01L 2924/181; H01L 2924/00012; H01L 2924/00014; H01L 2224/48137; H01L 2224/73265; H01L 25/0753; H01L 25/167; H01L 33/486; H01L 33/507; H01L 33/54; H01L 33/62; G06F 3/044; G06F 3/0416; G06F 2203/04104; G06F 3/03545; G06F 3/0412; G06F 11/3051; G06F 1/26; G06F 1/266; G06F 1/28; G06F 2203/04101; G06F 2203/04105; G06F 2203/04111
See application file for complete search history.

(56) References Cited

U.S. PATENT DOCUMENTS

| | | | |
|---|---|---|---|
| 2005/0088863 A1 | 4/2005 | Pearce | |
| 2010/0020581 A1* | 1/2010 | Mazzola | H02M 3/33569 363/132 |
| 2011/0222595 A1* | 9/2011 | Choi | H04B 3/548 375/238 |

FOREIGN PATENT DOCUMENTS

| | | |
|---|---|---|
| DE | 102011003733 | 8/2012 |
| EP | 2444817 A2 | 4/2012 |
| WO | WO-9810301 A1 | 3/1998 |

OTHER PUBLICATIONS

"Current Sensing Power MOSFETs" NXP Semiconductors. Rev. 2, Jun. 2009. <http://www.nxp.com/documents/application_note/AN10322.pdf>.

(Continued)

*Primary Examiner* — Roy Y Yi
(74) *Attorney, Agent, or Firm* — Harness, Dickey & Pierce, P.L.C.

(57) ABSTRACT

In one example embodiment, an apparatus includes a power electronics switching circuit having a semiconductor switch and a device in communication with the power electronics switching circuit. The device includes a processor configured to estimate a current through the power electronics switching circuit based on a first voltage across the semiconductor switch, a control signal controlling the semiconductor switch and a first voltage-current characteristic of the semiconductor switch.

22 Claims, 13 Drawing Sheets

(51) Int. Cl.
G01R 19/32 (2006.01)
H02M 1/00 (2006.01)

(56) References Cited

OTHER PUBLICATIONS

Domes, Daniel et al. "IGBT-Module integrated Current and Temperature Sense Features based on Sigma-Delta Converter". Infineon Technologies AG. <http://www.infineon.com/dgdl/Infineon—Editorial—PCIM Europe 2009—IGBT Module integrated current and temperature sense features.pdf?folderId=db3a304412b407950112b4096af601e2 &fileId=db3a30432ddc4fc8012ddc7b4bfb0009> Accessed Dec. 18, 2013.

Donlon, John F. "New Compact IGBT Modules with Integrated Current and Temperature Sensors". Powerex Incorporated. <http://www.pwrx.com/pwrx/app/pet%202005%2012_4.pdf> Accessed Dec. 18, 2013.

"Fault Detection and Protection" Chapter 3, Section 6. pp. 208-210. <http://www.semikron.com/skcompub/en/eng_3_6_3_1.pdf> Accessed Dec. 18, 2013.

Tam, David. "ICs Protect IGBTs and Sense Currents in Motor Drives". Power Electronics Technology. Apr. 2005.

Chen, Hong Lei, "Protect IGBT's by Sensing Current Using Optical Isolation Amplifiers." Avago Technologies. <http://www.avagotech.com/docs/AV02-3457EN> Accessed Dec. 18, 2013.

Schwarzer, Ulrich et al. "IGBT Module with Integrated Current Measurement Unit Using Sgma-Delta Conversion for Direct Digital Motor Control." Infineon Technologies AG. Warstein, Germany. <http://www.infineon.com/dgdl/Infineon—Editorial—PCIM Europe 2010—IGBT Module with integrated current measurement unit.pdf?folderId=db3a304412b407950112b4095af601e2 &fileId=db3a30432ddc4fc8012ddca3c8fa0036> Accessed Dec. 18, 2013.

Lepkowski, Jim. "Motor Control Sensor Feedback Circuits" Microchip Technology Inc. 2003.

Search Report for European Application No. 14196155.7 dated May 8, 2015.

Erik R. Olson and Robert D. Lorenz, "Integrating Giant Magnetoresistive Current and Thermal Sensors in Power Electronic Modules," Dept. of Mechanical Engineering and Dept. of Electrical & Computer Engineering University of Wisconsin—Madison, Madison, WI 53706, USA, pp. 773-777, 2003.

Stephen P. Robb, Aileen A. Taomoto, S. Larry Tu, "Current Sensing in IGBTs for Short-Circuit Protection," Proc. of the 6th Internat. Symposium on Power Semiconductor Devices & IC's, Davos. Switzerland May 31-Jun. 2, 1994, Session 3: Poster Session I IGBT Paper 3.7, pp. 81-85.

* cited by examiner

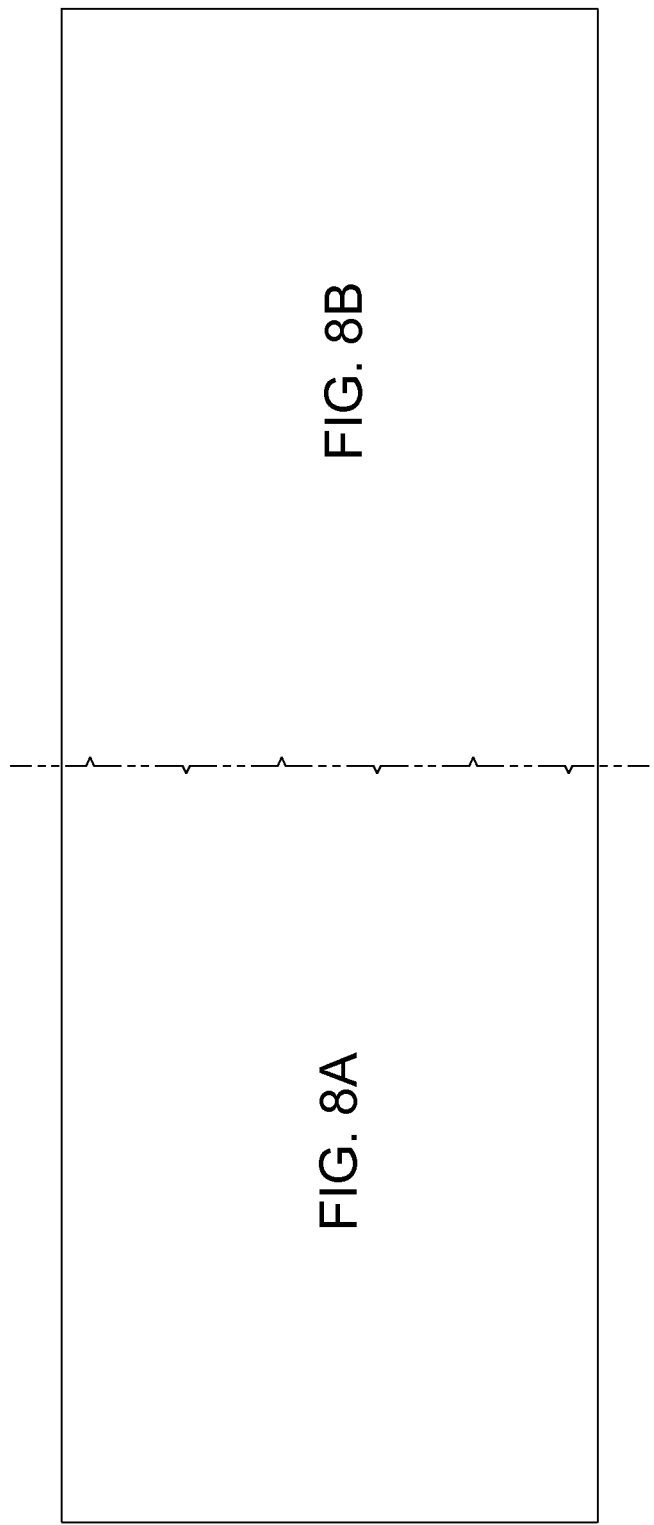

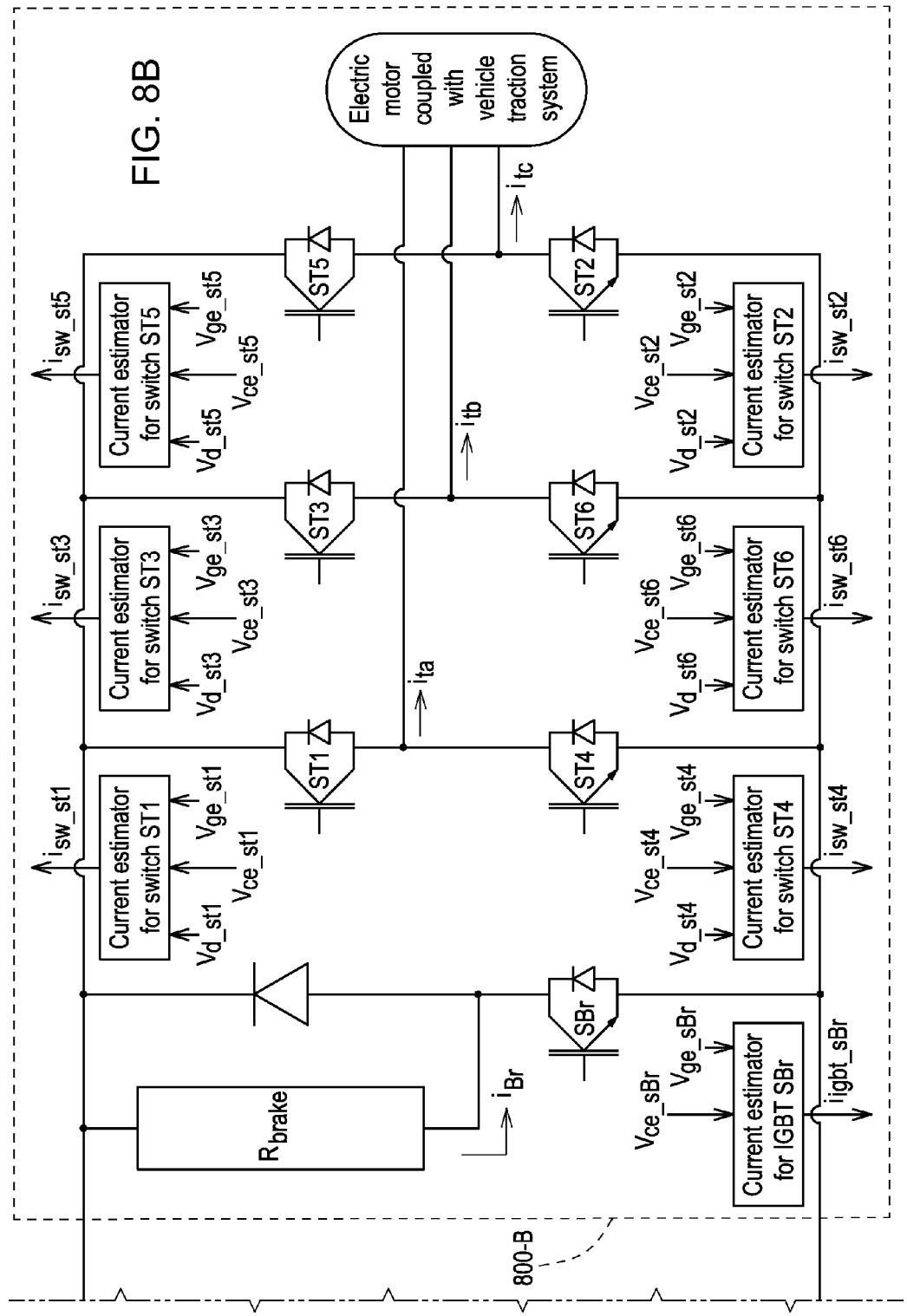

SENSORLESS CURRENT SENSING METHODS FOR POWER ELECTRONIC CONVERTERS

FIELD

Example embodiments are related to power conversion circuits and methods for estimating a current flowing through power electronic converters and/or switches used therein.

BACKGROUND

Conventional low cost current sensing methods deploy open loop current sensors in high power inverter and converter applications. An open loop current sensor is an integrated potted plastic-case assembly of Hall element, silicon-iron magnetic core, electronic circuit and connectors. Such open loop current sensors encounter significant temperature rise due to iron losses in their magnetic core. Therefore, open loop sensors pose constraints in handling the current flowing through the power electronics switches being monitored and/or sensed by them.

In addition, there is a direct proportionality between cost and level of performance of such current sensors. Moreover, assembly, packaging, reliability and thermal issue are also of concern. Volumetric space occupied by current sensors render many surrounding areas, in the power electronic assembly, unusable. Such unused spaces may negatively impact power density (kW/Kg) and/or energy density (kW/liter) of power electronics assemblies with added vulnerabilities in the design such as thermal failure modes in the current sensor that are difficult to detect and remedy in a fast and timely manner.

SUMMARY

Some embodiments are directed to methods and apparatuses for estimating a current flowing through power electronic converters and/or switches used in power conversion circuits.

In one example embodiment, an apparatus includes a power electronics switching circuit having a semiconductor switch and a device in communication with the power electronics switching circuit. The device includes a processor configured to estimate a current through the power electronics switching circuit based on a first voltage across the semiconductor switch, a control signal controlling the semiconductor switch and a first voltage-current characteristic of the semiconductor switch.

In one example embodiment, an electrical structure includes a first apparatus including a first power electronics switching circuit having a semiconductor switch and a first device, the first device including a first processor configured to estimate a first portion of a current flowing through the first power electronics switching circuit based on a first voltage across the semiconductor switch of the first power electronics switching circuit, a first control signal controlling the semiconductor switch of the power electronics switching circuit and a first voltage-current characteristic of the semiconductor switch of the power electronics switching circuit. The electrical structure further includes a second apparatus including a second power electronics switching circuit and a second device, the second device including a second processor configured to estimate a second portion of the current flowing through the second power electronics switching circuit based on a second voltage across a semiconductor switch of the second power electronics switching circuit, a second control signal controlling the semiconductor switch of the second power electronics switching circuit and a first voltage-current characteristic of the semiconductor switch of the second power electronics switching circuit. The processor further includes a third processor configured to estimate the current based on the estimated first portion of the current and the estimated second portion of the current.

In one example embodiment, a method includes measuring a first voltage across a semiconductor switch of a first power electronics switching circuit and estimating a current through the power electronics switching circuit based on the measured first voltage, a control signal controlling the semiconductor switch and a first voltage-current characteristic of the semiconductor switch.

BRIEF DESCRIPTION OF THE DRAWINGS

Example embodiments will be more clearly understood from the following detailed description taken in conjunction with the accompanying drawings. FIGS. 1-5B represent non-limiting, example embodiments as described herein.

FIG. 1 depicts an apparatus including a power electronics switching circuit and a device for estimating a current flowing through the power electronics switching circuit, according to an example embodiment;

FIG. 2 illustrates a flowchart of a method of estimating the current flowing through the power electronics switching circuit shown in FIG. 1, according to an example embodiment;

FIG. 3 depicts another apparatus including a power electronics switching circuit and a device for estimating a current flowing through the power electronics switching circuit, according to an example embodiment;

FIG. 4 illustrates a flowchart of a method of estimating the current flowing through the power electronics switching circuit shown in FIG. 3, according to an example embodiment;

FIG. 5 depicts an electrical structure with a high-side apparatus and a low-side apparatus and a device in each apparatus for estimating a portion of a current flowing through a power electronics switching circuit included in each apparatus, according to an example embodiment;

DETAILED DESCRIPTION

Figure 1:
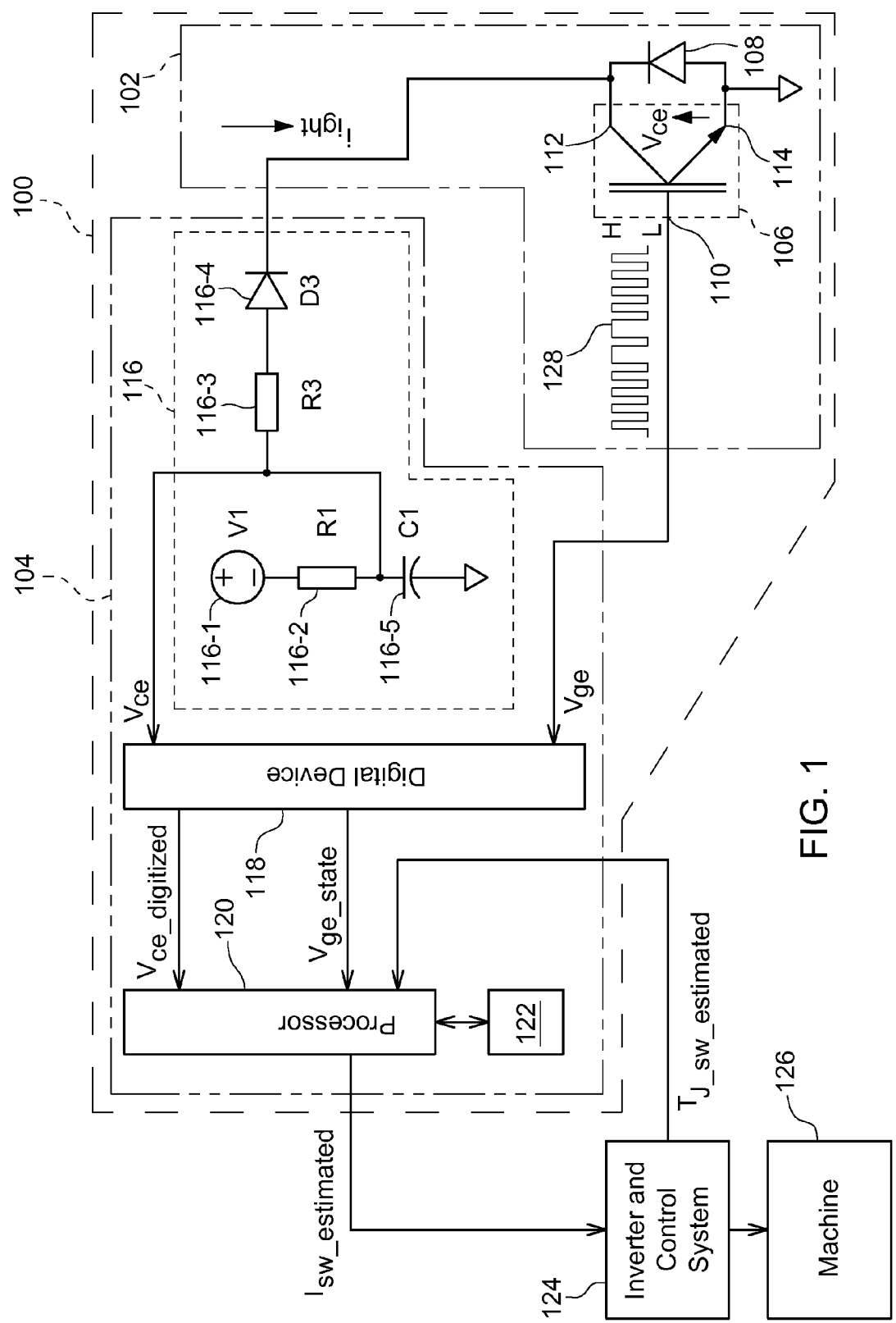

Some example embodiments will now be described more fully with reference to the accompanying drawings in which some example embodiments are illustrated.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the claims. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Portions of example embodiments and corresponding detailed description are presented in terms of software, or algorithms and symbolic representations of operation on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

In the following description, illustrative embodiments will be described with reference to acts and symbolic representations of operations (e.g., in the form of flowcharts) that may be implemented as program modules or functional processes including routines, programs, objects, components, data structures, etc., that perform particular tasks or implement particular abstract data types and may be implemented using existing hardware. Such existing hardware may include one or more Central Processing Units (CPUs), digital signal processors (DSPs), application-specific-integrated-circuits, field programmable gate arrays (FPGAs) computers or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

Note also that the software implemented aspects of example embodiments are typically encoded on some form of tangible (or recording) storage medium or implemented over some type of transmission medium. The tangible storage medium may be magnetic (e.g., a floppy disk or a hard drive) or optical (e.g., a compact disk read only memory, or "CD ROM"), and may be read only or random access. Similarly, the transmission medium may be twisted wire pairs, coaxial cable, optical fiber, or some other suitable transmission medium known to the art. Example embodiments are not limited by these aspects of any given implementation.

FIG. 1 depicts an apparatus including a power electronics switching circuit and a device for estimating a current flowing through the power electronics switching circuit, according to an example embodiment. The apparatus 100 may include a power electronics switching circuit 102 and a current sensing device 104 (hereinafter referred to as the device 104).

The power electronics switching circuit 102 may include a semiconductor switch 106 and a diode 108. A current $I_{IGBT}$ (or alternatively, $I_{MOSFET}$) may be flowing through the power electronics switching circuit 102, as shown in FIG. 1, an estimate of which may be determined, as will be explained below. The semiconductor switch 106 may be an Insulated Gate Bi-polar Transistor (IGBT) having a gate 110, a collector 112 and an emitter 114. The semiconductor switch 106 may also be a Metal Oxide Semiconductor Field Effect Transistor (MOSFET) (e.g., nMOS, pMOS, etc.), wherein elements 110, 112 and 114 may be a gate, a drain and a source, respectively. It will be appreciated that the semiconductor switch 106 is not limited to the above IGBT and FET type transistors but may include any other known or to be developed semiconductor based transistors.

The device 104 may include a first circuit 116, a digital device 118, a processor 120 and a memory 122. The first circuit 116 may include a DC voltage source 116-1, a first resistance element 116-2, a second resistance element 116-3, a diode 116-4 and a capacitance element 116-5 connected between the first resistance element 116-2 and a ground. The digital device 118 may have a built-in analog to digital converter (ADC), which may be a high-speed converter (e.g., conversion time is 100 s of nano-seconds) with a high accuracy (e.g. error less than 0.5%). The digital device 118 may also have input/output ports for receiving signals and/or outputting signals, as will be described below. The memory 122 may be any type of storage device, as described above. The memory 122 may be accessible by the processor 120. In one example embodiment, the memory 122 may be a separate unit in communication with the device 104. In one example embodiment, a field programmable gate array (FPGA) may be used instead of the memory 122. In one example embodiment, the FPGA may be used together with a microprocessor to form a complete system on chip. Accordingly, instead of the processor 120 and the memory 122, the complete system on chip may be used.

As will be explained in further detail below with reference to FIG. 2, the first circuit 116 may measure a collector-emitter voltage ($V_{ce}$) of the IGBT transistor 106 (or alternatively, a drain-source voltage ($V_{DS}$) of the MOSFET transistor). The digital device 118 may digitize the $V_{ce}$ ($V_{DS}$), via the built-in ADC. Furthermore, the digital device 118 may be able to read the state (ON or OFF) of gate-emitter voltage ($V_{ge}$) of the IGBT transistor (or, alternatively a gate-source voltage ($V_{GS}$) of the MOSFET transistor). $V_{ge}$ (or, alternatively $V_{gs}$) may be digitized signals read by the digital device 118 directly from a control signal 128. In one example embodiment, a voltage at the gate of the semiconductor switch 106 may be determined based on the control signal 128. The control signal 128 may determine the ON/OFF states of the semiconductor switch 106. For example, when the control signal 128 is high (H), the semiconductor switch 106 is ON and when the control signal 128 is low (L), the semiconductor switch 106 is OFF. H or L may also be represented as '1' or '0', respectively.

In one example embodiment, if the $V_{ge}$ (or, alternatively $V_{gs}$) is an analog signal, the digital device 118 may digitize such analog signals via the built-in ADC.

In one example embodiment, the digitized $V_{ge}$ (or, alternatively $V_{gs}$) may be known by the inverter and control system 124, described below). Accordingly, the inverter and control system 124 may communicate the information regarding $V_{ge}$ (or, alternatively $V_{gs}$) to the digital device 118 or in the alternative communicate $V_{ge}$ (or, alternatively $V_{gs}$) directly to the processor 120 to be used, as will be described below.

In one example embodiment, reading of the $V_{ge}$ (or, alternatively $V_{gs}$) by the digital device 118 as opposed to receiving such information from the inverter and control system 124, may result in synchronizing $V_{ge}$ (or, alternatively $V_{gs}$) with the measured value of the voltage drop across the semiconductor switch 106 (e.g., $V_{ce}$) and thus avoid any delay due to additional connectors/cables used in transmitting the information from the inverter and control system 124 to the processor 120.

The processor 120, as will be described below with respect to FIG. 2, may estimate the current through the power electronics switching circuit 102 based on the digitized voltages and a current-voltage characteristics of at least the semiconductor switch 104.

The current estimated by the processor 120 may then be used by an inverter and/or a control system 124 to control desired parameters (e.g., speed, torque, etc.) of the machine 126. The machine 126 may be any one of, but not limited to, a hybrid machine, a heavy equipment machine, etc. In one example embodiment, a certain torque and a certain speed may be desired for operating the machine 126. In order to provide the certain torque/speed, the inverter and control systems 124 supplies controlled currents at the regulated magnitude and frequency to electric motors in the machine 126, where the controlled currents may be determined based on the current estimated by the processor 120 of the device 104. The regulated magnitude and frequency may be supplied to electric motors in the machine 126 by turning ON or OFF the power electronics switching circuit (e.g., power electronics switching circuit 102).

Figure 2:
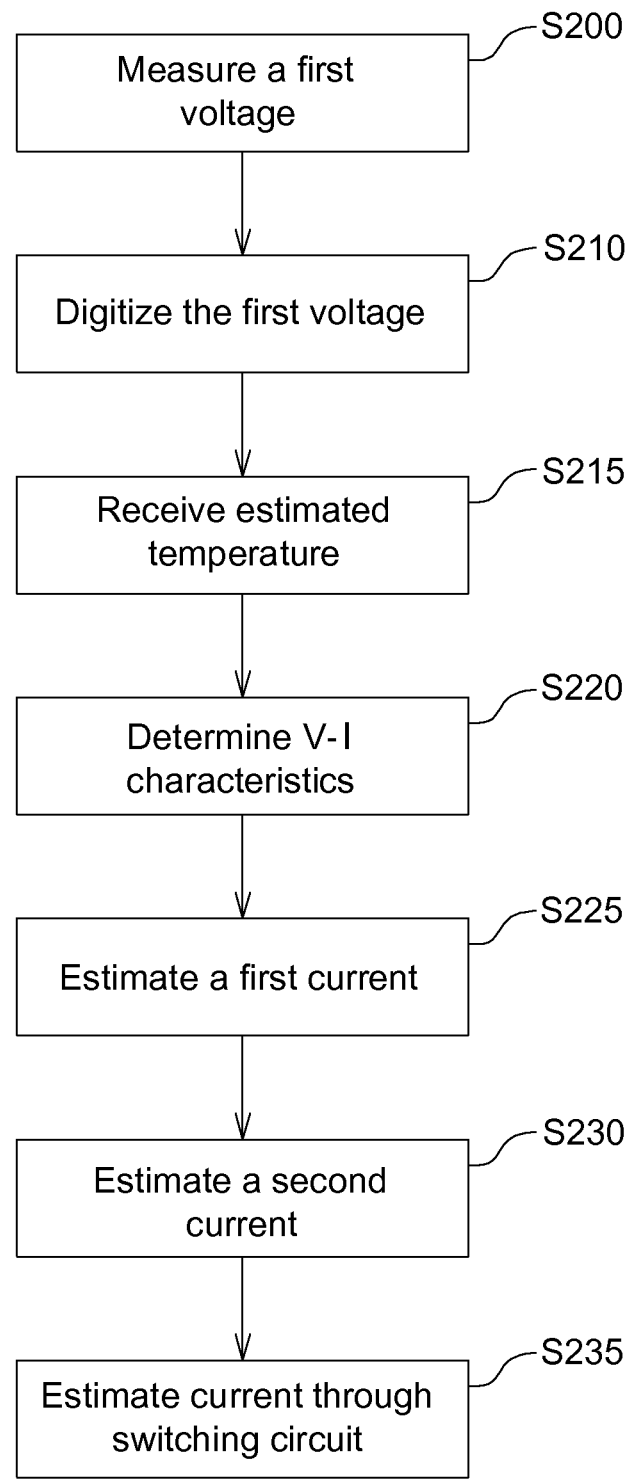

FIG. 2 illustrates a flowchart of a method of estimating the current flowing through the power electronics switching circuit shown in FIG. 1, according to an example embodiment. At S200, the first circuit 116 of the device 104 measures a first voltage (e.g., $V_{ce}$ or alternatively, $V_{DS}$), when the semiconductor switch 106 (IGBT transistor 106 or alternatively, the MOSFET transistor 106) is in the operating state (e.g., the semiconductor switch 106 is ON)). For example, when the semiconductor switch 106 is ON, the capacitor 116-5 (C1) may discharge to a level that is higher than a voltage across the semiconductor switch 106 by the amount of voltage drop across the diode 116-4 (D3). The voltage cross the diode 116-4 may remain constant and negligibly small over temperature fluctuations because at voltage balance condition stated above (e.g., capacitor 116-5 (C1) discharging by the amount that is higher than voltage across the semiconductor switch 106 by the amount of voltage drop across the diode 116-4 (D3)), no current flows from the capacitor 116-5 to the semiconductor switch 106 via the resistor 116-3 (R3) and the diode 116-4. Therefore, the voltage drop across the capacitor 116-5 may be the same as the voltage across the semiconductor switch 106 and thus its value may be measured so as to measure the voltage across the semiconductor switch 106 (e.g., $V_{ce}$ in IGBT or, alternatively $V_{DS}$ in FET).

At S210, the digital device 118 of the device 104 may digitize the first voltage. The digital device 118 may further, as described above, read $V_{ge}$ or $V_{GS}$ of the semiconductor switch 106, depending on the type of the semiconductor switch 106.

At S215, the processor 120 of the device 104 may receive an estimate of the temperature of the power electronics switching circuit. Such estimated temperature may be provided from the inverter/control system 124. The semiconductor switch 106 may exhibit different voltage-current (may also be referred to as voltage-ampere) characteristics at different temperatures. Similarly, the diode 108 may exhibit different voltage-current (may also be referred to as voltage-ampere) characteristics at different temperatures. The different voltage-ampere characteristics of the semiconductor switch 106 and/or different voltage-ampere characteristics of the diode 108, over a range of temperatures, may be programmed/stored in the memory 122.

In one example embodiment, the memory 122 may have been programmed or may have stored thereon different voltage current characteristic data of not only the semiconductor switch 106/diode 108 but also that of any additional semiconductor switches/diode and/or other electronic circuit elements that may be used in one or more power electronics switching circuits.

The voltage-current characteristic data of the semiconductor switch 106 and/or the diode 108 may be initially provided by the manufacturer/supplier of the semiconductor switch 106 and/or diode 108. Furthermore, the voltage-current characteristics of the semiconductor switch 106 and/or the diode 108 may be adjustable by a user. For example, adjusting of such voltage-current characteristics may be due to field tests, empirical data, motor load/generator load/electrical machine load characteristics and or based on voltage-current characteristics of semiconductor switches/diodes that may be used as replacements for the semiconductor switch 106 and the diode 108, where the replacements may have been manufactured/provided by a different manufacturer/supplier.

Accordingly, at S220 and upon receiving the estimated temperature, the processor 120 may access the memory 122 and determine a corresponding one of the voltage-current characteristics data from among data stored on the memory 122, which corresponds to the semiconductor switch 106 and/or diode 108.

At S225, the device 104, via the processor 120, may estimate a first current flowing through the semiconductor switch 106. The processor 120 may estimate the first current using three inputs. The three inputs may be the digitized first voltage across the collector-emitter or drain-source of the semiconductor switch 106, $V_{ge}$ or $V_{GS}$ of the semiconductor switch 106 (e.g., indicating whether the semiconductor switch 106 is ON or OFF), and a voltage-current characteristic of the semiconductor switch 106 corresponding to the received temperature.

In one example embodiment, the processor 120 may estimate the first current by executing a program, where the program implements a polynomial-based current estimation algorithm, a degree/order and form of which may be a matter of design choice and/or determined empirically. For example, during an initial configuration of the algorithm, tests may be performed during which polynomials of various forms and degrees/orders may be implemented and the results (e.g., estimated currents) may be compared to currents measured by, for example, high-fidelity, high accuracy and high-precision current probes, so as to determine the appropriate form and degree/order of such polynomial. Similar techniques may be applied to determine other appropriate polynomials, which will be described below for determining other values (currents, voltages, etc.).

The processor 120 may estimate the current flowing through the power electronics switching circuit 102 at every specific time interval, where the number of time intervals may be regulated by a clock rate of a clock (not shown) of the processor 120 (e.g., the clock rate may be in the nano-seconds range). In one example embodiment, the processor 120 may estimate the current flowing through the power electronics switching circuit 102 whenever power electronics switching circuit 102 changes its status from ON to OFF and OFF to ON. Furthermore, the processor 120's clock may be synchronized with switching frequency of the control signal 128. Since Inverter control system is communicating with the processor 120 and the digital device 118, therefore clock can be synchronized with switching frequency of power electronics switching circuit 102.

To estimate the current, the processor 120 may input the three received inputs into the program according to the following:

$$i_{IGBT\_estimated\,(n)} = f(v_{ce\_digitized\,(n)}, v_{ge\_state\,(n)}, T_{J\_sw\_estimated}) \quad (1)$$

where, n corresponds to the $n^{th}$ sampling interval, $i_{IGBT\_estimated}$ is the $n^{th}$ sampling interval estimated current flowing through the semiconductor switch 106, $f$ is a function that implements the polynomial, $v_{ce\_digitized\,(n)}$ is the digitized first voltage (e.g., $V_{ce}$ or alternatively, $V_{DS}$) at the $n^{th}$ sampling interval, $v_{ge\_state\,(n)}$ is the digitized $V_{ge}$ or the $V_{GS}$ of the semiconductor switch 106 at the $n^{th}$ sampling interval and $T_{J\_sw\_estimated}$ is the estimated temperature of the power electronics switching circuit 106. It will be appreciated that $i_{IGBT\_estimated\,(n)}$ may be replaced by $i_{MOSFET\_estimated\,(n)}$ if the semiconductor switch 106 is a MOSFET transistor.

Once the processor 120 estimates the first current at S225, the processor 120 estimates a second current, for the $(n+1)^{th}$ sampling interval flowing through the diode 108 at S230. In one example embodiment, the processor 120 may estimate the second current as follows.

In order to estimate the current flowing through the power electronics switching circuit 102, the processor 120 may first determine a voltage drop across the diode 108 for the $n^{th}$ sampling interval, based on the estimated first current flowing through the semiconductor switch 106 determined at S225. The processor 120 may determine the $n^{th}$ sampling interval voltage drop across the diode 108 using the polynomial with appropriate form and degree/order. The processor may determine the voltage drop across the diode 108, as follows:

$$v_{d(n)} = f(i_{IGBT\_estimated\,(n)}, v_{ge\_states\,(n)}, (\text{volt-ampere})_{diode}, T_{J\_sw\_estimated}) \quad (2)$$

wherein $v_{d(n)}$ is the voltage drop for the $n^{th}$ sampling interval, to be determined, across the diode 108, $f$ is a function that implements the appropriate polynomial, $i_{IGBT\_estimated\,(n)}$ (or, alternatively, $i_{MOSFET\_estimated(n)}$) is the $n^{th}$ sampling interval current flowing through the semiconductor switch 106, estimated at S225, $(\text{volt-ampere})_{diode}$ is the voltage-ampere characteristic of the diode 108 at $T_{J\_sw\_estimated}$, which is the estimated temperature of the power electronics switching circuit.

Once the voltage drop across the diode is determined, the processor 120 may estimate the second current flowing through the diode 108 for the $(n+1)^{th}$ sampling interval. The processor 120 may estimate the current flowing through the diode 108 using the polynomial with appropriate form and degree/order. The processor may estimate the current flowing through the diode 108, as follows:

$$i_{diode\_estimated(n+1)} = f\{v_{d(n)}, (\text{volt-ampere})_{diode}, T_{J\_sw\_estimated}\} \quad (3)$$

wherein $i_{diode\_estimated(n+1)}$ is the $(n+1)^{th}$ sampling interval current, to be estimated, flowing through the diode 108. $v_{d(n)}$ is the $n^{th}$ sampling interval voltage drop across the diode 108, $f$ is a function that implements the appropriate polynomial, $(\text{volt-ampere})_{diode}$ is the voltage-ampere characteristic of the diode 108 and $T_{J\_sw\_estimated}$ is the estimated temperature of the power electronics switching circuit.

At S235, the processor 120 may estimate the current flowing through the power electronics switching circuit, $i_{sw\_estimated}$, based on the first current estimated at S225 and the second current estimated at S230. In one example embodiment, the processor 120 may estimate the current flowing through the power electronics switch as the sum of the first and second currents estimated at S225 and S230, respectively.

In one example embodiment, estimating the current flowing through the power electronics switching circuit 102 as described with respect to FIGS. 1-2 and through the use of a polynomial-based current estimation algorithm, eliminates the need for using external current sensors, which have the disadvantages, described above.

Figure 3:
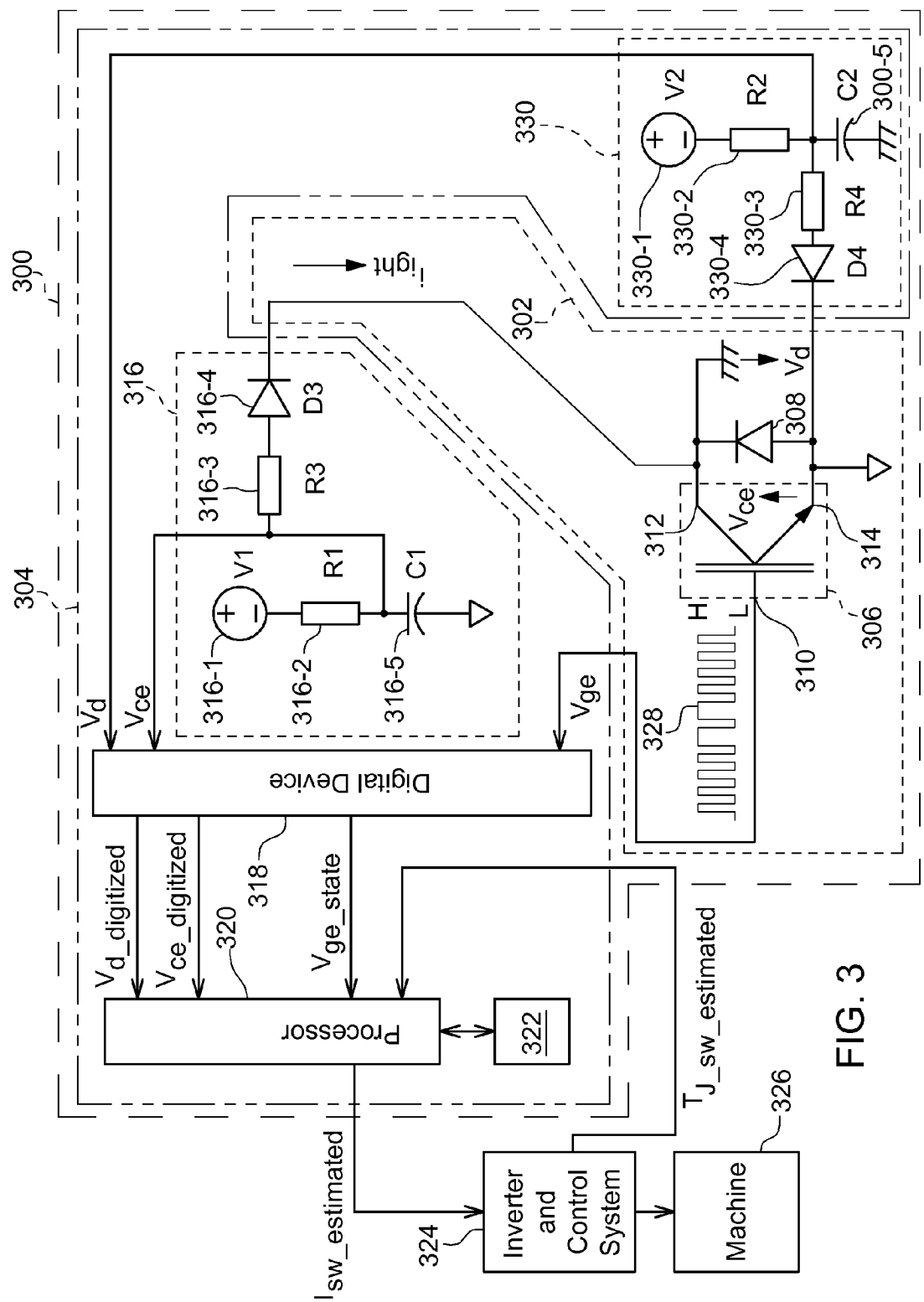

FIG. 3 depicts another apparatus including a power electronics switching circuit and a device for estimating a current flowing through the power electronics switching circuit, according to an example embodiment. The apparatus 300 is similar to the apparatus 100, except as described below. Elements designated by reference numerals 300, 302, 304, 306, 308, 310, 312, 314, 316-1 to 316-5, 318, 320, 322, 324, 326 and 328 in FIG. 3, are the same as elements designated by reference numerals 100, 102, 104, 106, 108, 110, 112, 114, 116-1 to 116-5, 118, 120, 122, 124, 126 and 128 in FIG. 1. Therefore, a description of elements of apparatus 300 corresponding to the described elements of apparatus 100 is omitted.

As can be seen from FIG. 3, the device 302, compared to its counterpart 102, includes an additional second circuit 330, which as will be described below, may be utilized to measure a voltage across the diode 308. Similar to the first circuit 316, the second circuit also includes a voltage source 330-1, a first resistance element 330-2, a second resistance element 330-3, a diode 330-4 and a capacitance element 330-5.

Figure 4:
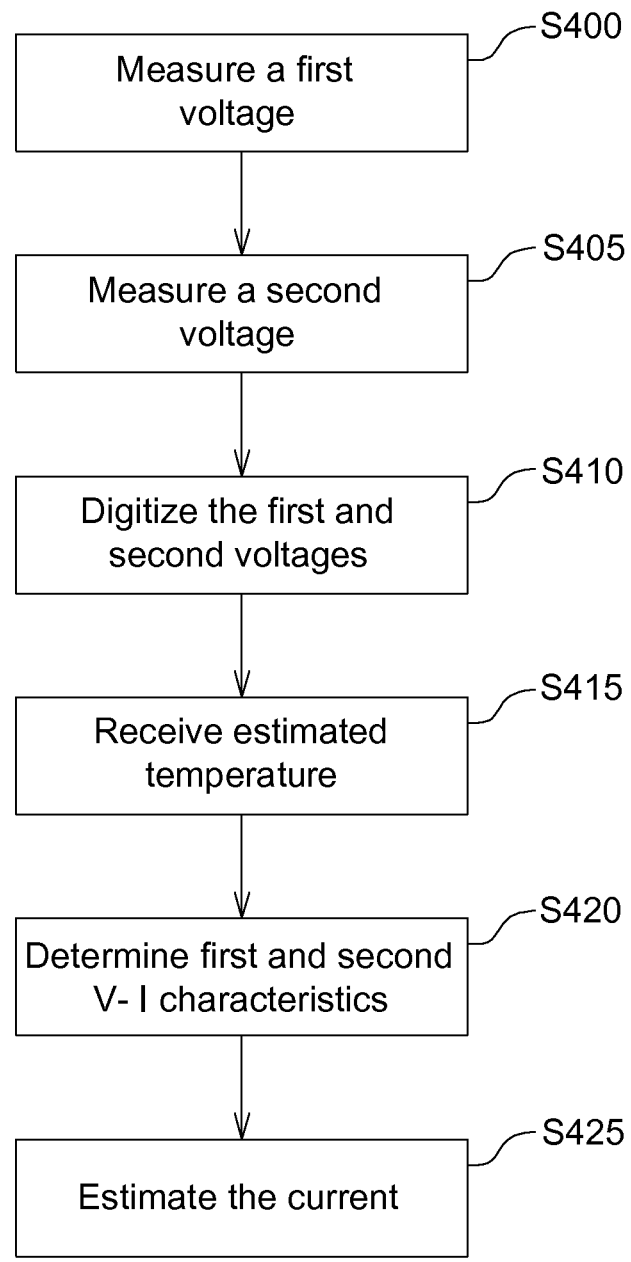

FIG. 4 illustrates a flowchart of a method of estimating the current flowing through the power electronics switching circuit shown in FIG. 3, according to an example embodiment. At S400, the device 304, via the first circuit 316 measure a first voltage across the collector-emitter/drain-source of the semiconductor switch 306 ($V_{ge}$ or $V_{DS}$, depending on the type of the semiconductor switch 306. The manner in which the first circuit 316 measures the first voltage across the collector emitter/drain-source of the semiconductor switch 306, is the same as that described at S200, in FIG. 2.

At S405, the device 304, via the second circuit 330, measures a second voltage across the diode 308. For example, when the diode 308 is conducting (e.g., when the semiconductor device 306 is OFF), the capacitor 330-5 (C2) may discharge to a level that is higher than a voltage across the diode 308 by the amount of voltage drop across the diode 330-4 (D4). The voltage cross the diode 330-4 may remain constant and negligibly small over temperature fluctuations because at voltage balance condition stated above (e.g., capacitor 330-5 (C2) discharging by the amount of voltage drop across the diode 330-4 plus voltage across the diode 308), no current flows from the capacitor 330-5 to the diode 308 via the resistor 330-3 (R4) and the diode 330-4. Therefore, the voltage drop across the capacitor 330-5 may be the same as the voltage across the diode 308 and thus its value may be measured so as to measure the voltage across the diode 308.

At S410, the device 304, via the digital device 318 digitizes the first and second voltages measured at S400 and S405, respectively. The digital device 318 may further digitize $V_{ge}$ or $V_{GS}$ of the semiconductor switch 306, depending on the type of the semiconductor switch 306. The digital device 318 is the same as the digital device 118 described with reference to FIG. 1.

At S415 the processor 320 may receive an estimate of the temperature of the power electronics switching circuit 302. The processor 320, similar to processor 120, may receive the temperature estimate from the inverter/control system 324.

At S420, similar to the process described with respect to S220, the processor 320 may determine the appropriate voltage-current characteristics of the semiconductor switch 306/diode 308, based on the estimated temperature of the power electronics switching circuit received at S415.

At S425, the device 304, via the processor 320, may estimate the current $i_{sw\_estimated}$ flowing through the power electronics switching circuit 302. The device 304 may synchronize the digitized first and second voltages with the digitized $V_{ge}$ or $V_{GS}$ of the semiconductor switch 306, determined at S410. The device 304 may then feed synchronized voltages into the processor 320. The processor 320 may implement a polynomial based current estimation algorithm, which may take the digitized first and second voltages, the digitized $V_{ge}$ or $V_{GS}$ of the semiconductor switch 306 as well as the estimate temperature of the power electronics switching circuit 302. The output of the implemented polynomial based algorithm may be the estimated current flowing through the power electronics switching circuit 302. As discussed above, the form and degree/order of the underlying polynomial may be based on empirical studies and/or may be a matter of design choice.

In one example embodiment, estimating the current flowing through the power electronics switching circuit 302 as described with respect to FIGS. 3-4 and through the use of a polynomial-based current estimation algorithm, eliminates the need for using external current sensors, which have the disadvantages, described above.

In one example embodiment, an inverter such as the inverter 124 of FIG. 1 and/or the inverter 324 of FIG. 3 may be a dual system inverter used for on-board power generation and traction systems in machines (e.g., hybrid machines). Accordingly different power electronics switching systems may be associated with a high-side (HS) and a low-side (LS) of the dual system inverter. In order to estimate a current for each phase of the inverter (e.g., inverter 124/324), a first portion of the current flowing through the HS power electronics switching circuit and a second portion of the current flowing through the LS power electronics switching circuit need to be estimated.

Figure 5:
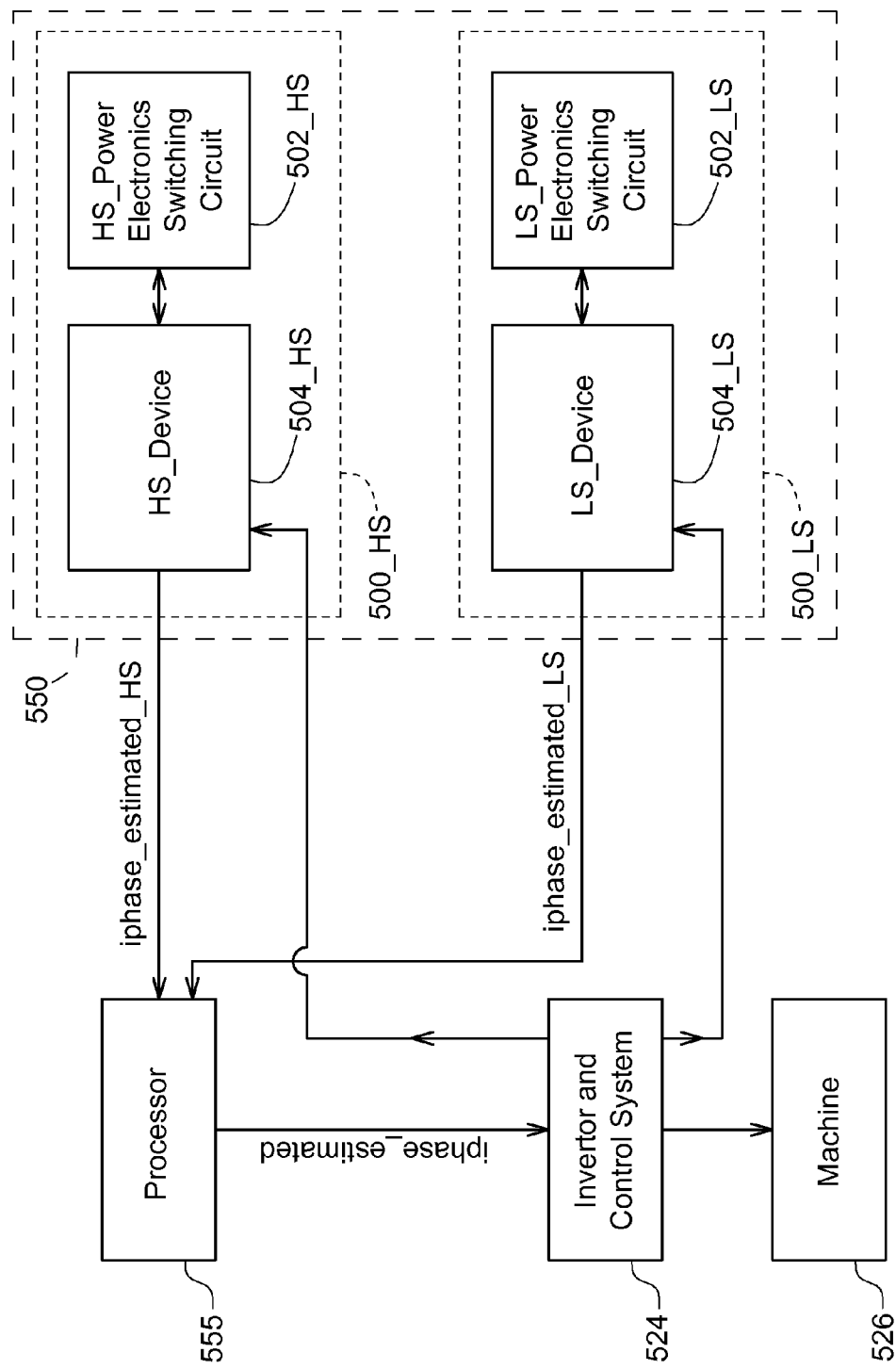

FIG. 5 depicts an electrical structure with a high-side apparatus and a low-side apparatus and a device in each apparatus for estimating a portion of a current flowing through a power electronics switching circuit included in each apparatus, according to an example embodiment. As shown in FIG. 5, the electrical structure 550 includes a pair of a HS apparatus 500-HS, a LS apparatus 500-LS and a processor 555. The HS side apparatus 500-HS includes a HS power electronics switching circuit 502-HS and a HS device 504-HS. The LS side apparatus 500-LS includes a LS power electronics switching circuit 502-LS and a LS device 504-LS. The HS apparatus 500-HS is the same as the apparatus 100 shown in FIG. 1. The LS apparatus 500-LS is the same as the apparatus 100 shown in FIG. 1. Accordingly, for a given sampling interval, the processor of the HS device 504-HS estimates a first portion of the current, $i_{phase\_estimated\_HS}$, flowing through the HS power electronics switching circuit 502-HS, in the same manner as that described above with reference to FIG. 2. Similarly, for the given sampling interval, the processor of the LS device 504-LS estimates a second portion of the current, $i_{phase\_estimated\_LS}$, flowing through the LS power electronics switching circuit 502-LS, in the same manner as that described above with reference to FIG. 2.

Thereafter, the processor 555 may estimate the current $i_{phase\_estimated}$ by, for example, adding the $i_{phase\_estimated\_HS}$ and $i_{phase\_estimated\_LS}$ estimated by processors of the 504-HS and 504-LS, respectively. Thereafter, the $i_{phase\_estimated}$ may be used by the inverter 524 to control the machine 526.

Figure 6:
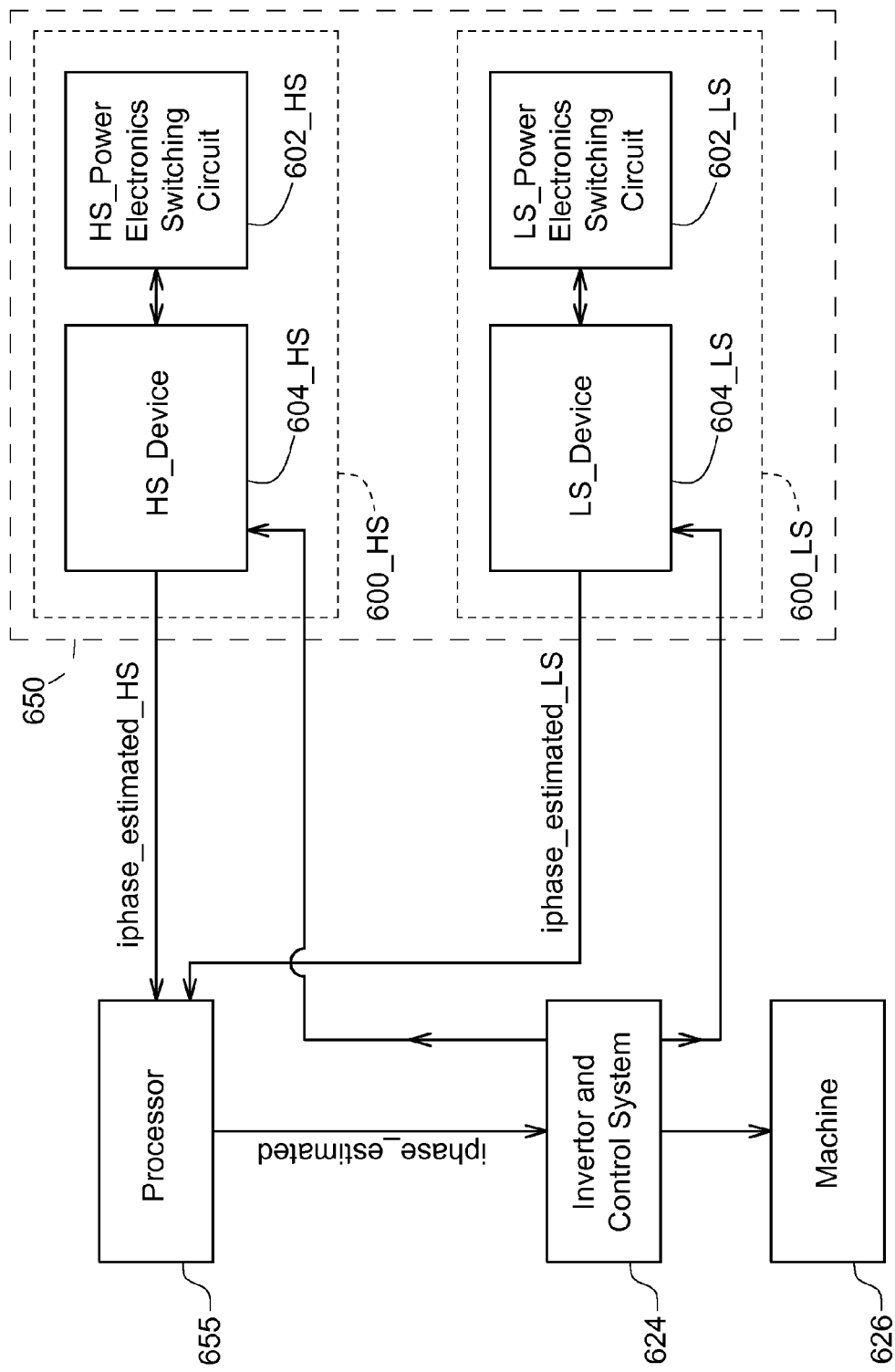
FIG. 6 depicts another electrical structure with a high-side apparatus and a low-side apparatus and a device in each apparatus for estimating a portion of a current flowing through a power electronics switching circuit included in each apparatus, according to an example embodiment.

FIG. 6 depicts another electrical structure with a high-side apparatus and a low-side apparatus and a device in each apparatus for estimating a portion of a current flowing through a power electronics switching circuit included in each apparatus, according to an example embodiment. As shown in FIG. 6, the electrical structure 650 includes a pair of a HS apparatus 600-HS, a LS apparatus 600-LS and a processor 655. The HS side apparatus 500-HS includes a HS power electronics switching circuit 602-HS and a HS device 604-HS. The LS side apparatus 600-LS includes a LS power electronics switching circuit 602-LS and a LS device 604-LS. The HS apparatus 600-HS is the same as the apparatus 300 shown in FIG. 3. The LS apparatus 600-LS is the same as the apparatus 300 shown in FIG. 3. The processor of the HS device 604-HS estimates a first portion of the current $i_{phase\_estimated\_HS}$, flowing through the HS power electronics switching circuit 602-HS, in the same manner as that described above with reference to FIG. 4. The processor of the LS device 604-LS estimates a second portion of the current, $i_{phase\_estimated\_LS}$, flowing through the LS power electronics switching circuit 602-LS, in the same manner as that described above with reference to FIG. 4.

Thereafter, the processor 655 may estimate the current $i_{phase\_estimated}$ by, for example, adding the $i_{phase\_estimated\_HS}$ and $i_{phase\_estimated\_LS}$ estimated by processors of the 604-HS and 604-LS, respectively. Thereafter, the $i_{phase\_estimated}$ may be used by the inverter 624 to control the machine 626.

Figure 7C:
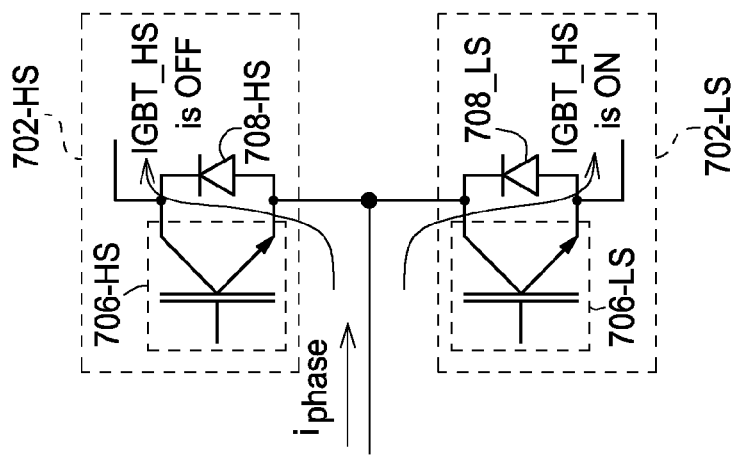
FIGS. 7A-C illustrates converter phase having a HS and LS power electronics switching circuit as well as directions of the phase current for the converter phase, according to an example embodiment.
Figure 7B:
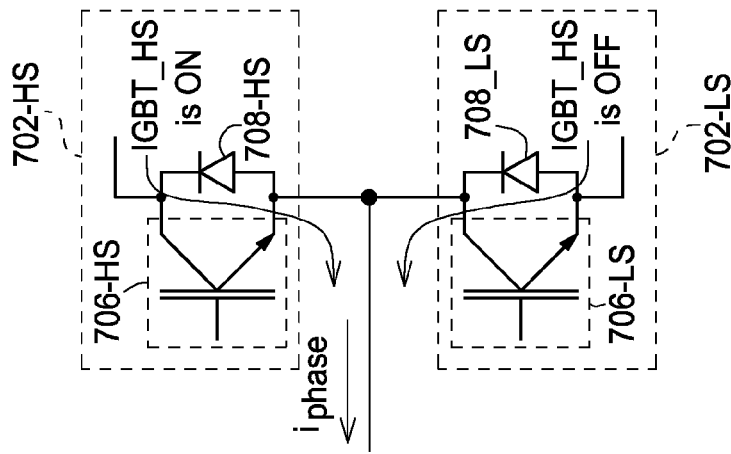
Figure 7A:
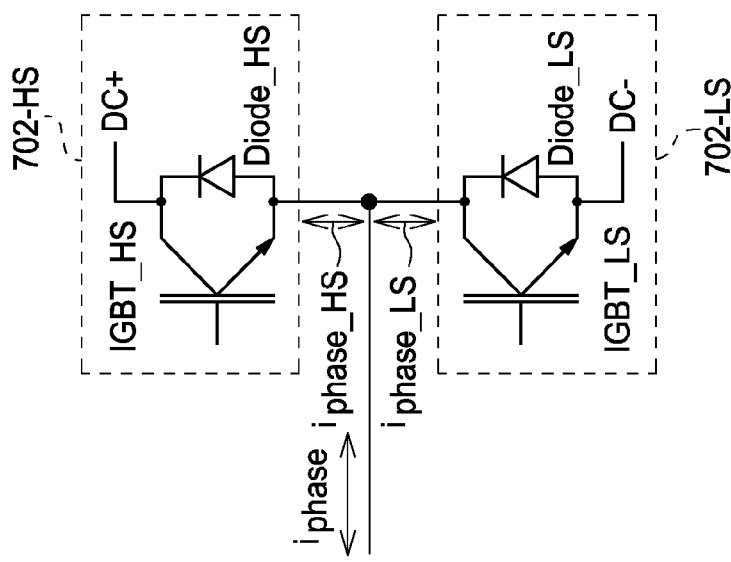

FIGS. 7A-C illustrates converter phase having a HS and LS power electronics switching circuit as well as directions of the phase current for the converter phase, according to an example embodiment. As shown in FIG. 7A, $i_{phase}$ is a resultant of two currents, $i_{phase-HS}$ and $i_{phase-LS}$ from the HS power electronics switching circuit 702-HS and the LS power electronics switching circuit 702-LS, respectively. As shown in FIG. 7B, when the semiconductor switch 706-HS is ON, $i_{phase-HS}$ flows through the semiconductor switch 706-HS while no current flows through the diode 708-HS. Also, when the semiconductor switch 706-HS is ON, semiconductor switch 706-LS is OFF and $i_{phase-LS}$ flows through the diode 708-LS. Therefore, $i_{phase}$ is the sum of the current flowing through the semiconductor switch 706-HS and the current flowing through diode 708-LS. Similarly, as shown in FIG. 7C, when the semiconductor switch 706-HS is OFF, semiconductor switch 706-LS is ON and thus $i_{phase}$ may be a sum of the current flowing through the diode 708-HS and the current flowing through the semiconductor switch 706-LS.

Based on the method described with reference to FIG. 2, the determination of the currents and voltages, described with respect to FIGS. 7A-C, may be based on the following. $i_{IGBT\_estimated(n)\_HS}$ of the semiconductor switch 706-HS, for the $n^{th}$ sampling interval, may first be determined according to equation (4) below:

$$i_{IGBT\_estimated(n)\_HS} = f(v_{ce\_digitized(n)\_HS}, v_{ge\_state(n)}, T_{J\_sw\_estimated\_HS}) \quad (4)$$

Using the estimated IGBT current for the HS, a voltage drop across the LS diode 708-LS may be determined according to equation (5) below:

$$v_{d(n-1)\_LS} = f(i_{IGBT\_estimated(n-1)\_HS}, v_{ge\_state(n-1)\_HS}, v_{ge\_state(n-1)\_LS}, (\text{volt- ampere})_{diode\_LS}, T_{J\_sw\_estimated\_LS}) \quad (5)$$

Using the estimated voltage drop across the diode 708-LS, the current flowing through the LS diode 708-LS may be determined according to equations (6) below:

$$i_{diode\_estimated(n)\_LS} = f\{v_{d(n-1)\_LS}, (\text{volt-ampere})_{diode\_LS}, T_{J\_sw\_estimated\_LS}\} \quad (6)$$

Accordingly, $i_{phase}$ may be given by:

$$i_{sw\_estimated(n)} = i_{IGBT\_estimated(n)\_HS} + i_{diode\_estimated(n)\_LS} \quad (7)$$

In one example embodiment, applying the method described with respect to FIG. 4 (e.g., measuring the voltage drops across the semiconductor switches 706-HS/706-LS and diodes 708-HS/708-LS) to FIG. 7, the $i_{phase}$ may be determined as follows:

$$i_{phase\_estimated(n)\_HS} = i_{IGBT\_estimated(n)\_HS} + i_{diode\_estimated(n)\_HS} \quad (8)$$

$$i_{phase\_estimated(n)\_LS} = i_{IGBT\_estimated(n)\_LS} + i_{diode\_estimated(n)\_LS} \quad (9)$$

Where $i_{IGBT\_estimated(n)\_HS}$, $i_{IGBT\_estimated(n)\_LS}$, $i_{diode\_estimated(n)\_HS}$ and $i_{diode\_estimated(n)\_HS}$ in (8) and (9) may be determined based on voltage drops measured across the HS/LS semiconductor switches and diodes, given by:

$$v_{sw\_digitized(n)\_HS} = v_{ce\_digitized(n)\_HS} + v_{d\_digitized(n)\_HS} \quad (10)$$

$$v_{sw\_digitized(n)\_LS} = v_{ce\_digitized(n)\_LS} + v_{d\_digitized(n)\_LS} \quad (11)$$

$$i_{phase\_estimated(n)\_HS} = f\{v_{sw\_digitized(n)\_HS}, v_{ge\_state(n)\_HS}, v_{ge\_state(n)\_LS}\} \quad (12)$$

$$i_{phase\_estimated(n)\_LS} = f\{v_{sw\_digitized(n)\_LS}, v_{ge\_state(n)\_HS}, v_{ge\_state(n)\_LS}\} \quad (13)$$

Then, $$i_{phase\_estimated(n)} = i_{phase\_estimated(n)\_HS} + i_{phase\_estimated(n)\_HS} \quad (14)$$

Figure 8A:
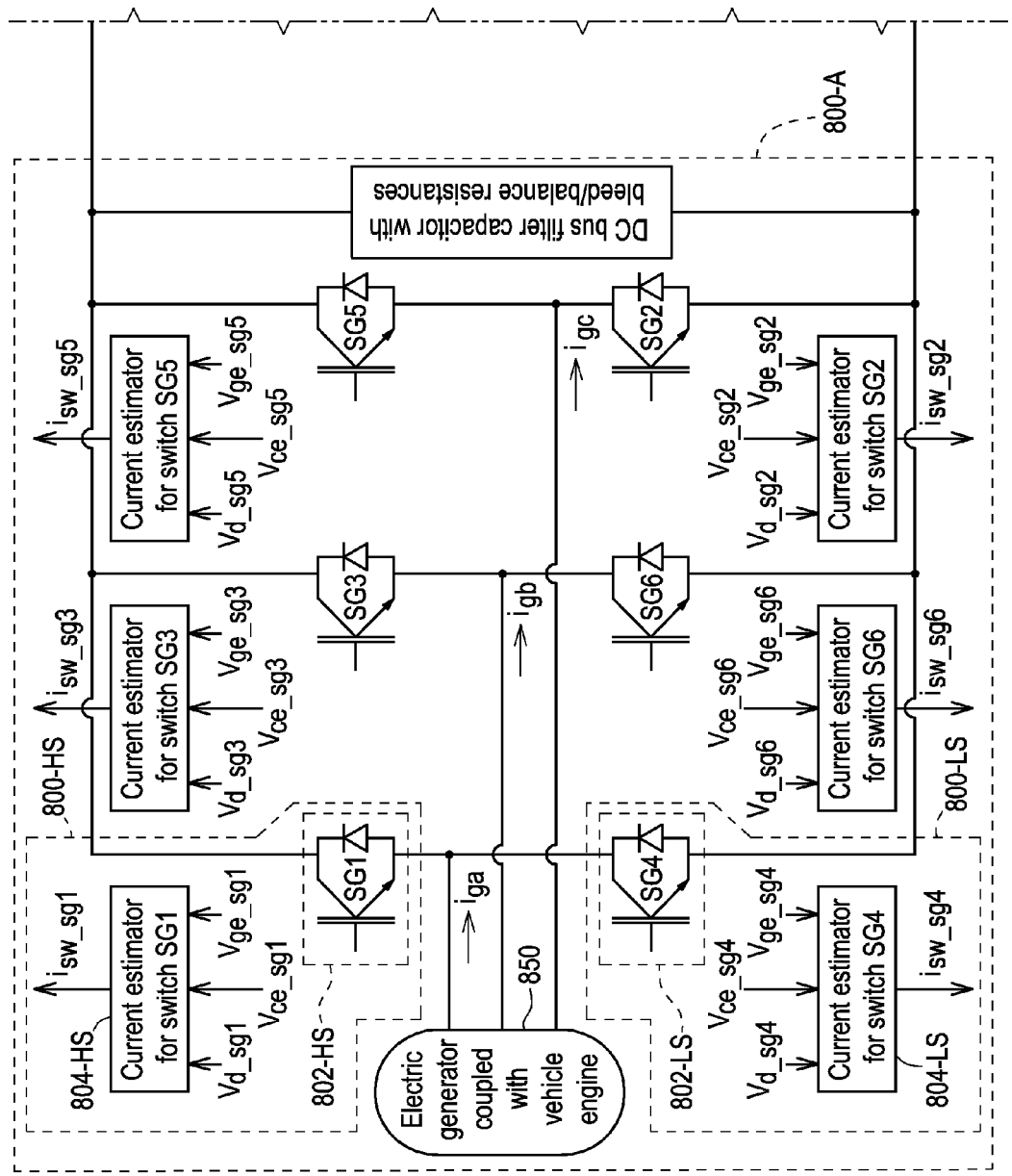
FIG. 8 illustrates a dual inverter system deployable for on-board power generation and traction systems in hybrid vehicles, employing a plurality of apparatuses described with respect to FIGS. 1-2, according to an example embodiment.

FIG. 8 illustrates a dual inverter system deployable for on-board power generation and traction systems in hybrid vehicles, employing a plurality of apparatuses described with respect to FIGS. 1-2, according to an example embodiment. FIG. 8 illustrates a circuit configuration 800-A for on-board power generation where a plurality of apparatuses such as those described with respect to FIG. 1 and FIG. 3 are utilized in the dual inverter system (e.g., 800 HS/LS numbered and shown as an example of the plurality of apparatuses). Each apparatus comprises a power electronics switching circuit (e.g., 802-HS or 802-LS) and a device (e.g., 804-HS or 804-LS) for estimating a current flowing through the corresponding one of the power electronics switches 802-HS/802-LS. The estimated currents (e.g., output $i_{sw-sg1}$ of the device 804-HS or output $i_{sw-sg4}$ of the device 804-LS, for example) may then be used to control each phase of the three-phase current, generated by the electric generator 850, associated one pair of HS/LS power electronics switching circuit (e.g., 802-HS and 802-LS), as shown in FIG. 8.

Furthermore, FIG. 8 illustrates a circuit configuration 800-B for on-board traction system where a plurality of apparatuses such as those described with respect to FIG. 1 and FIG. 3 are utilized in a similar manner as that described with respect to the circuit configuration 800-A.

While FIG. 8 illustrates a dual inverter system deployable for on-board power generation and traction systems in hybrid vehicles, employing a plurality of apparatuses described with respect to FIGS. 1-2, the plurality of apparatuses described with respect to FIG. 3-4 may also be used (either concurrently with or in place of that described with respect to FIG. 1-2).

Figure 9A:
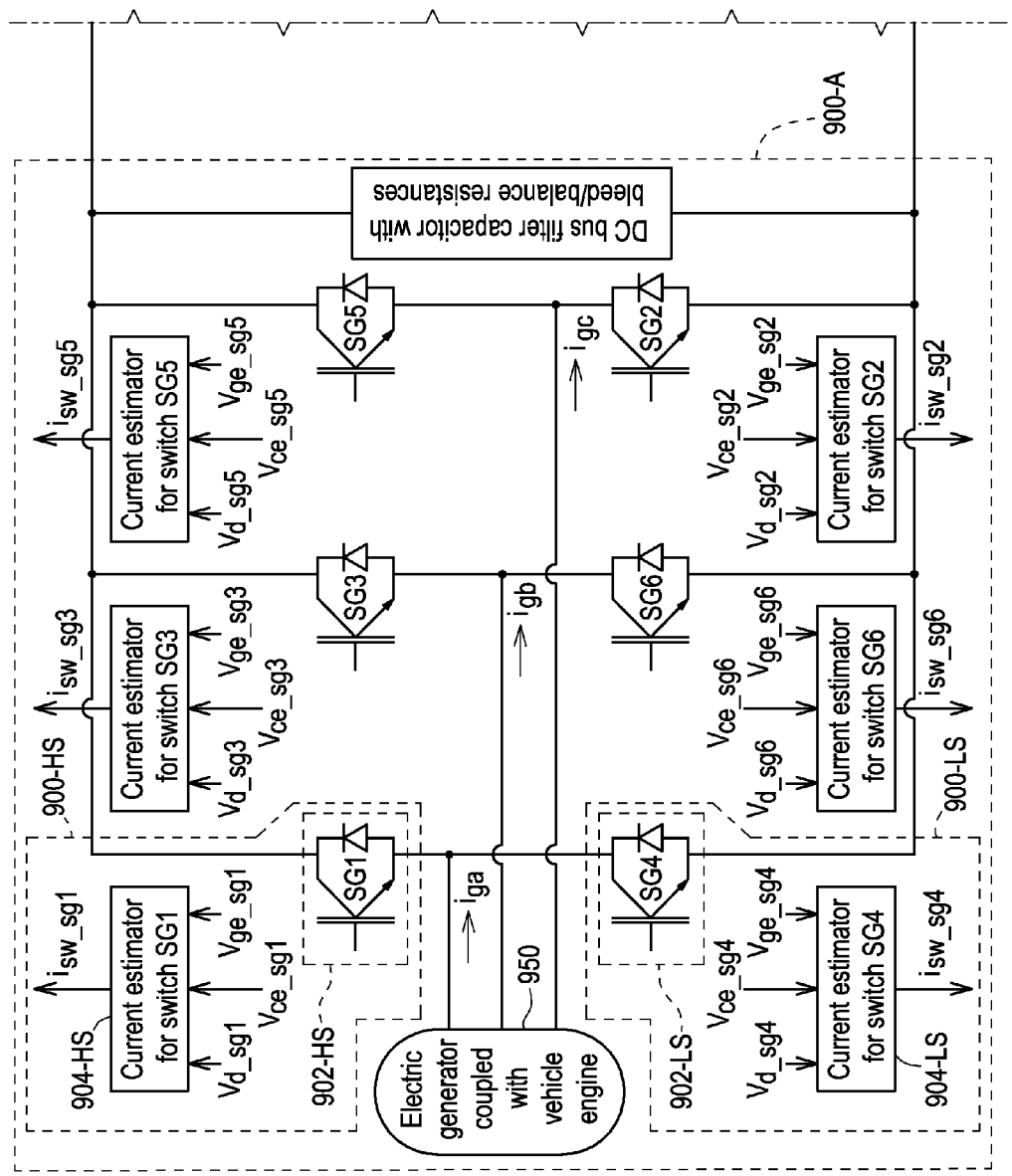
FIG. 9 illustrates a permanent magnet generator with a three phase output and an n-phase switch reluctance machine, employing a plurality of apparatuses described with respect to FIGS. 1-2, according to an example embodiment.
Figure 9B:
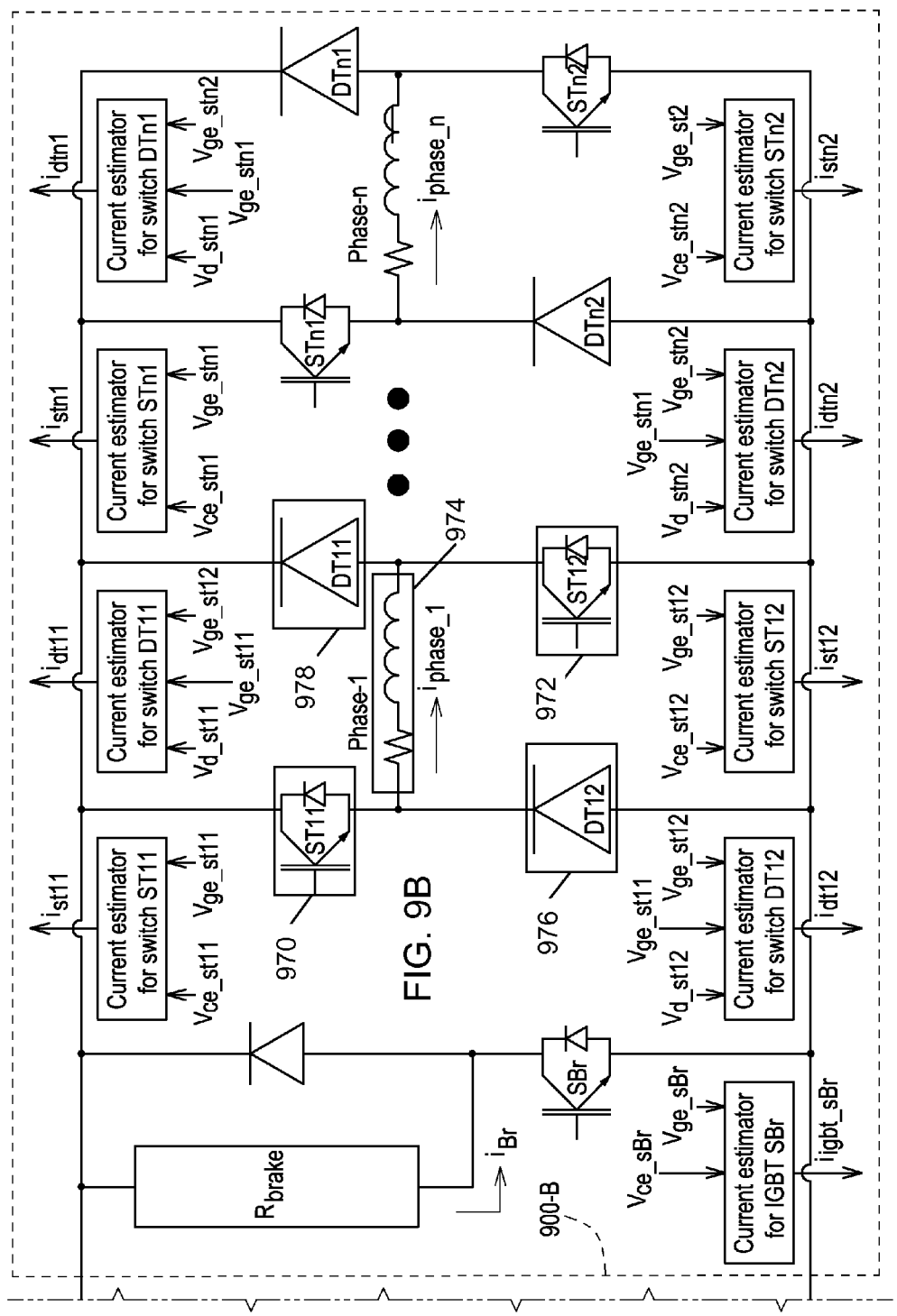

FIG. 9 illustrates a permanent magnet generator with a three phase output and an n-phase switch reluctance machine, employing a plurality of apparatuses described with respect to FIGS. 1-2, according to an example embodiment.

FIG. 9 illustrates a circuit configuration 900-A, which may be a permanent magnet (PM) generator with a three-phase output, where a plurality of apparatuses such as those described with respect to FIG. 1 and FIG. 3 are utilized (e.g., 900 HS/LS numbered and shown as an example of the plurality of apparatuses). Each apparatus comprises a power electronics switching circuit (e.g., 902-HS or 902-LS) and a device (e.g., 904-HS or 904-LS) for estimating a current flowing through the corresponding one of the power electronics switches 902-HS/902-LS. The estimated currents (e.g., output $i_{sw-sg1}$ of the device 904-HS or output $i_{sw-sg4}$ of the device 904-LS, for example) may then be used to control each phase of the three-phase output of the permanent magnet generator 900-A, generated by the electric generator 950, associated with one pair of HS/LS power electronics switching circuit (e.g., 902-HS and 902-LS), as shown in FIG. 9.

Furthermore, FIG. 9 illustrates a circuit configuration 900-B, which may be an n-phase switch reluctance machine, where a plurality of apparatuses such as those described with respect to FIG. 1 and FIG. 3 are utilized in a similar manner as that described with respect to the circuit configuration 900-A.

There are four operating modes associated with the each phase of the n-phase switch reluctance machine 900-B. Accordingly, a description of phase 1 of the switch reluctance (SR) machine 900-B will be given as an example of the n-phase switch reluctance machine 900-B.

In Mode 1, the power electronics switching circuit 970 (ST11) and the power electronics switching circuit 972 (ST12), shown in FIG. 9, are ON. Therefore, a current ($i_{phase\_1}$) through SR traction machine winding 974 will be established. As the machine winding 974 is connected across inverter's DC bus and DC bus forward (+$V_{dc}$), connected to the switching power electronics switching circuit 970 and 974 (shown in FIG. 3 but not in FIG. 9), application of inverter DC bus voltage across the machine winding 974 will cause the current ($i_{phase\_1}$) through the machine winding 974 to rise. Then SR machine phase current is expressed as below;

$$i_{phase\_1} = i_{st11} = i_{st12} \quad (15)$$

In Mode 2, the power electronics switching circuit 970 (ST11) is ON and the power electronics switching circuit (ST12) is OFF. Therefore, current flowing through the SR machine will free-wheel and no voltage will be applied across the SR machine winding 974. Accordingly, the amount of current through the SR machine may decline at a rate governed by machine time constant $$\left(\tau = \frac{L_{SR}}{R_{SR}}\right).$$

Accordingly, $$i_{phase\_1} = i_{st11} = i_{dt11} \quad (16)$$

In Mode 3, the power electronics switching circuit 970 (ST11) is OFF and the power electronics switching circuit (ST12) is ON. Therefore, current through SR machine will free-wheel and no voltage will be applied across the SR machine winding 974. Accordingly, the amount of current through the SR machine may decline at a rate governed by machine time constant ($\tau$). Accordingly, $$i_{phase\_1} = i_{st12} = i_{dt12} \quad (17)$$

In Mode 4, the power electronics switching circuit 970 (ST11) and the power electronics switching circuit (ST12) are OFF. Therefore, current flowing through SR machine will free-wheel through diode 976 (DT12) and the diode 978 (DT12) and back to inverter DC causing regenerative braking. Therefore, reverse voltage (-$V_{dc}$) will be applied across the SR machine winding 974. Due to application of reverse voltage (-$V_{dc}$) current through SR machine winding 974 will decline at a faster rate than the free-wheel current condition stated above. Accordingly, $$i_{phase\_1} = i_{dt12} = i_{dt11} \quad (18)$$

From equations (15) to (18), it will be appreciated that if the currents through the power electronics switches 970 and 972 (ST11 and ST12) and the diodes 976 and 978 (DT11 and DT12) are estimated using methods described with respect to FIGS. 1-2, the phase current of SR machine 900-B may be estimated accurately without using any external current sensors, which provides the advantages described below.

While FIG. 9 illustrates a permanent magnet generator with a three phase output and an n-phase switch reluctance machine, employing a plurality of apparatuses described with respect to FIGS. 1-2, the plurality of apparatuses described with respect to FIG. 3-4 may also be used (either concurrently with or in place of that described with respect to FIG. 1-2).

In yet another example embodiment, the apparatuses described with respect to FIG. 1 and FIG. 3 may be utilized in current sensing for inverter needed for brushless DC motor having trapezoidal back electro-motive force (emf) and rectangular wave shaped current.

As described above, the example current sensing apparatuses and the corresponding polynomial based estimation methods, described above with reference to FIGS. 1-4, eliminate the need for external current sensors conventionally used to sense current of power electronics switching circuits.

Some of the advantages of utilizing the current sensing apparatuses and associated methods, described above include, first, significant cost reduction may be achieved as current sensors and the associated assembly is eliminated. Second, errors caused by current sensors will be eliminated, therefore, electric drive control systems will offer improved and precise performance due to elimination of variations caused by current sensors and current sensor processing circuit. Third, the electric drive will be able to respond much faster to abnormal conditions in the electric drive such as over current conditions and inverter output shorted to vehicle chassis. This may be due to the current estimation scheme implemented within a fast digital processor (e.g., processor 120 of FIG. 1), where the associated clock time may be in nano-seconds as opposed to sensor response of conventional current sensors which is in micro-seconds. Fourth, the current sensing apparatuses described above, will result in elimination or reduction in the number of current sensors in electric-drive, therefore resulting in simpler overall inverter systems having smaller footprints, lower cost associated therewith, and an increased reliability due to elimination of breakdown(s) caused by sensor failure(s) as may be the case with conventional current sensors that fail due to vibration and over temperature caused by, for example, self-heating in such sensors.

Example embodiments being thus described, it will be obvious that the same may be varied in many ways. Such variations are not to be regarded as a departure from the spirit and scope of example embodiments, and all such modifications as would be obvious to one skilled in the art are intended to be included within the scope of the claims.

What is claimed is:

1. An apparatus comprising:
a power electronics switching circuit having a semiconductor switch; and
a device in communication with the power electronics switching circuit, the device including a processor configured to,
measure a first voltage across the semiconductor switch,
estimate a semiconductor switch-specific current through the semiconductor switch based on the measured first voltage, a control signal controlling the semiconductor switch and a first voltage-current characteristic of the semiconductor switch,
determine a second voltage across a diode of the power electronics switching circuit based on the estimated semiconductor switch-specific current, the control signal and a second voltage-current characteristic of the diode,
estimate a diode-specific current through the second component based on the determined second voltage and the second voltage-current characteristic, and
estimate a current through the power electronics switching circuit based on the estimated semiconductor switch-specific current and the estimated diode-specific current.

2. The apparatus of claim 1, wherein
the device further comprises a first circuit configured to measure the first voltage across the semiconductor.

3. The apparatus of claim 2, wherein
the device further comprises an analog to digital converter configured to digitize the measured first voltage, and
the processor is configured to estimate the semiconductor switch-specific current based on the digitized measured first voltage, the control signal and the first voltage-current characteristic.

4. The apparatus of claim 1, wherein the processor is configured to,
receive an estimate of a temperature of the power electronics switching circuit, and
determine the first voltage-current characteristic and the second voltage-current characteristic corresponding to the received estimate of the temperature.

5. The device of claim 1, wherein
the device further comprises a first circuit and a second circuit,
the first circuit is configured to measure the first voltage, and
the second circuit is configured to measure the second voltage.

6. The apparatus of claim 5, wherein the device further comprises a digital to analog converter configured to,
digitize the measured first voltage and the measured second voltage,
estimate the semiconductor switch-specific current through the semiconductor switch based on the digitized first voltage, the control signal controlling the semiconductor switch and the first voltage-current characteristic of the semiconductor switch, and
estimate the diode-specific current based on the digitized measured second voltage and the second voltage-current characteristic.

7. The device of claim 1, wherein
the semiconductor switch is at least one of an Insulated Gate Bi-polar Transistor (IGBT) and a Field Effect Transistor (MOSFET), and
the first voltage is at least one of a collector-emitter voltage of the IGBT and a drain-source voltage of the MOSFET.

8. The apparatus of claim 1, wherein the device is configured to send the estimated current to an inverter controlling a machine.

9. The apparatus of claim 1, wherein the processor is configured to estimate the current by inputting the first voltage, the control signal and the first voltage-current characteristic into a polynomial-based current estimation algorithm.

10. An electrical structure comprising:
a first apparatus including a first power electronics switching circuit having a semiconductor switch and a first device, the first device including a first processor configured to estimate a first portion of a current flowing through the first power electronics switching circuit based on a first voltage across the semiconductor switch of the first power electronics switching circuit, a first control signal controlling the semiconductor switch of the power electronics switching circuit and a first voltage-current characteristic of the semiconductor switch of the power electronics switching circuit;
a second apparatus including a second power electronics switching circuit and a second device, the second device including a second processor configured to,
measure a second voltage across a semiconductor switch of the second power electronics switching circuit,
estimate a semiconductor switch-specific current flowing through the semiconductor switch of the second power electronics switching circuit based on the measured second voltage,
estimate a diode-specific current flowing through a diode of the second power electronics switching circuit based on the estimated semiconductor switch-specific current, and
estimate a second portion of the current flowing through the second power electronics switching circuit based on the estimated semiconductor switch-specific current, the estimated diode-specific current, a second control signal controlling the semiconductor switch of the second power electronics switching circuit and a first voltage-current characteristic of the semiconductor switch of the second power electronics switching circuit; and
a third processor configured to estimate the current based on the estimated first portion of the current and the estimated second portion of the current.

11. The electrical structure of claim 10, wherein
the first apparatus further comprises a first circuit configured to measure the first voltage across the semiconductor switch of the first power electronics switching circuit, and
the first processor is configured to,
estimate a semiconductor switch-specific current flowing through the semiconductor switch of the first power electronics switching circuit based on the measured first voltage,
estimate a diode-specific current flowing through a diode of the first power electronics switching circuit based on the estimated semiconductor switch-specific current, and estimate the first portion of the current based on the estimated semiconductor switch-specific current and the estimated diode-specific current.

12. The electrical structure of claim 10, wherein the second apparatus further comprises a first circuit configured to measure the second voltage.

13. The electrical structure of claim 10, wherein the first apparatus further comprises,
   a first circuit configured to measure the first voltage across the semiconductor switch of the first power electronics switching circuit, and
   a second circuit configured to measure a third voltage across a diode of the first power electronics switching circuit, and
the first processor is configured to estimate the first portion of the current flowing through the first power electronics switching circuit based on the measured first voltage, the measured third voltage, the first control signal, the first voltage-current characteristic of the semiconductor switch of the first power electronics switching circuit and a second voltage-current characteristic of the diode of the first power electronics switching circuit.

14. The electrical structure of claim 10, wherein the second apparatus further comprises,
   a first circuit configured to measure the second voltage,
   a second circuit configured to measure a third voltage across a diode of
the second power electronics switching circuit, and
the second processor is configured to estimate the second portion of the current flowing through the second power electronics switching circuit based on the measured second voltage, the estimated semiconductor switch-specific current, the estimated diode-specific current, the measured third voltage, the second control signal, the first voltage-current characteristic of the semiconductor switch of the second power electronics switching circuit and a second voltage-current characteristic of the diode of the second power electronics switching circuit.

15. A method comprising:
measuring a first voltage across a semiconductor switch of a first power electronics switching circuit; and
estimating a semiconductor switch-specific current through the semiconductor switch based on the measured first voltage, a control signal controlling the semiconductor switch and a first voltage-current characteristic of the semiconductor switch;
determining a second voltage across a diode of the power electronics switching circuit based on the estimated semiconductor switch-specific current, the control signal and a second voltage-current characteristic of the diode;
estimating a diode-specific current through the second component based on the determined second voltage and the second voltage-current characteristic, and
estimating a current through the power electronics switching circuit based on the estimated semiconductor switch-specific current and the estimated diode-specific current.

16. The method of claim 15, further comprising:
digitizing the measured first voltage, wherein
the estimating estimates the semiconductor switch-specific current through the semiconductor switch based on the digitized measured first voltage, the control signal and the first voltage-current characteristic.

17. The method of claim 15, further comprising:
receiving an estimate of a temperature of the power electronics switching circuit, and
determining the first voltage-current characteristic and the second voltage-current characteristic corresponding to the received estimate of the temperature.

18. The method of claim 15, further comprising:
digitizing the measured first voltage and the measured second voltage, wherein
the estimating the semiconductor switch-specific current through the semiconductor switch estimates the semiconductor switch-specific current based on the digitized measured first voltage, the control signal controlling the semiconductor switch and the first voltage-current characteristic of the semiconductor switch, and
estimating the diode-specific current estimates the diode-specific current based on the digitized measured second voltage, the control signal and the first and second voltage-current characteristics.

19. The method of claim 15, wherein
the first component is at least one of an Insulated Gate Bi-polar Transistor (IGBT) and a Field Effect Transistor (MOSFET), and
the first voltage is at least one of a collector-emitter voltage of the IGBT and a drain-source voltage of the MOSFET.

20. The method of claim 15, further comprising:
sending the estimated current to an inverter controlling a machine.

21. The method of claim 20, wherein the inverter controls the machine without using a current sensor.

22. The method of claim 15, wherein the estimating estimates the current by inputting the first voltage, the control signal and the first voltage-current characteristic into a polynomial-based current estimation algorithm.

* * * * *